(12) United States Patent
Frazier et al.

(10) Patent No.: US 10,593,521 B2
(45) Date of Patent: Mar. 17, 2020

(54) SUBSTRATE SUPPORT FOR PLASMA ETCH OPERATIONS

(71) Applicant: APPLIED MATERIALS, INC., Santa Clara, CA (US)

(72) Inventors: Larry Frazier, Brentwood, CA (US); Cheng-Hsiung Matthew Tsai, Cupertino, CA (US); John C. Forster, Mountain View, CA (US); Mei Po Yeung, San Jose, CA (US); Michael S. Jackson, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1131 days.

(21) Appl. No.: 13/798,028

(22) Filed: Mar. 12, 2013

(65) Prior Publication Data

US 2014/0262043 A1 Sep. 18, 2014

(51) Int. Cl.
*H01L 21/67* (2006.01)
*H01L 21/687* (2006.01)
*H01J 37/32* (2006.01)

(52) U.S. Cl.
CPC .. *H01J 37/32715* (2013.01); *H01L 21/67103* (2013.01); *H01L 21/68735* (2013.01); *H01J 2237/334* (2013.01)

(58) Field of Classification Search
CPC ......... H01L 21/27; H01L 21/683–6833; H01L 21/687775; H01L 21/68735; H01L 21/687; H01L 21/6833; H01L 21/68775; H01L 21/67103; C23C 14/50; C23C 14/505; C23C 14/541; C23C 16/458–46; H01J 37/321–32119; H01J 37/32697–32724; H01J 37/32541; H01J 37/32715; H01J 2237/334

See application file for complete search history.

(56) References Cited

U.S. PATENT DOCUMENTS

| | | | |
|---|---|---|---|
| 4,692,836 A | * | 9/1987 | Suzuki .......................... 361/234 |
| 5,688,358 A | * | 11/1997 | Tanaka ................... H01J 37/321 156/345.48 |
| 5,716,486 A | * | 2/1998 | Selwyn et al. ............ 156/345.28 |
| 6,077,353 A | * | 6/2000 | Al-Sharif et al. ............ 118/500 |

(Continued)

FOREIGN PATENT DOCUMENTS

| | | |
|---|---|---|
| JP | S6369250 A | 3/1988 |
| KR | 20040049907 A | 6/2004 |

OTHER PUBLICATIONS

International Search Report and Written Opinion dated Jun. 20, 2014 for PCT Application No. PCT/US2014/016719.

*Primary Examiner* — Benjamin Kendall
(74) *Attorney, Agent, or Firm* — Moser Taboada; Alan Taboada

(57) ABSTRACT

Methods and apparatus for processing substrates are disclosed herein. In some embodiments, a substrate support to support a substrate in a processing chamber includes a dielectric insulator plate; a conductive plate supported on the dielectric insulator plate, the conductive plate comprising a top surface and a bottom surface defining a thickness between the top surface and the bottom surface, wherein an edge portion of the conductive plate tapers in a radially outward direction; and a dielectric plate comprising a substrate support surface disposed upon the top surface of the conductor plate.

19 Claims, 2 Drawing Sheets

(56) References Cited

U.S. PATENT DOCUMENTS

| | | |
|---|---|---|
| 6,193,803 B1 | 2/2001 | Sato et al. |
| 7,718,930 B2 | 5/2010 | Kawasaki et al. |
| 2002/0006678 A1 | 1/2002 | Inazumachi et al. |
| 2002/0075027 A1 | 6/2002 | Hollman et al. |
| 2002/0162630 A1 | 11/2002 | Satoh et al. |
| 2003/0029568 A1* | 2/2003 | Brown et al. ............ 156/345.51 |
| 2004/0250955 A1* | 12/2004 | Blonigan et al. ........ 156/345.51 |
| 2009/0101284 A1* | 4/2009 | Higuma ............ H01J 37/32532 |
| | | 156/345.51 |
| 2009/0194234 A1 | 8/2009 | Arai et al. |
| 2009/0308537 A1 | 12/2009 | Shibuya et al. |
| 2011/0073037 A1* | 3/2011 | Ohnishi ....................... 118/641 |
| 2011/0222038 A1* | 9/2011 | Yamashita ..................... 355/53 |
| 2012/0250212 A1* | 10/2012 | Kimura et al. ............... 361/234 |

\* cited by examiner

SUBSTRATE SUPPORT FOR PLASMA ETCH OPERATIONS

FIELD

Embodiments of the present invention generally relate to a semiconductor substrate processing.

BACKGROUND

In processing a semiconductor substrate, the presence of contaminants on the substrate or a layer applied to a substrate can adversely affect subsequent processes or the performance of the finished semiconductor device. Contaminants can include undesirable oxides of metals applied to the substrate or residue from processes, such as mask residue from etching processes.

To remove the contaminants, substrate processing can include a non-selective etch process, for example, an etch using an ionized form of an inert gas such as argon. The etching process may take place in a chamber in which a plasma of an inert gas is formed above a substrate supported on a substrate support. In some cases the substrate support is coupled to a biasing radio frequency (RF) source to attract the argon molecules toward the substrate.

The inventors have observed that in etching procedures, non-uniformities in etch rate occur at the edge of the substrate. Under some processing conditions, the observed non-uniformities are significant and can adversely affect the substrate being processed.

Accordingly, the inventors have devised embodiments of substrate supports that may facilitate improved etch rate uniformity during plasma etching processes.

SUMMARY

Methods and apparatus for processing substrates are disclosed herein. In some embodiments, a substrate support to support a substrate in a processing chamber comprises a dielectric insulator plate; a conductive plate supported on the dielectric insulator plate, the conductive plate comprising a top surface and a bottom surface defining a thickness between the top surface and the bottom surface, wherein an edge portion of the conductive plate tapers in a radially outward direction; and a dielectric plate comprising a substrate support surface disposed upon the top surface of the conductive plate.

In some embodiments, a substrate processing apparatus includes a processing chamber having an internal processing volume; an RF coil disposed proximate the process chamber to couple RF energy into the processing volume; a biasing RF source; and a substrate support as described in any of the embodiments disclosed herein disposed within the processing volume, wherein the conductive plate is coupled to the biasing RF source.

In some embodiments, a substrate support to support a substrate in a processing chamber includes a quartz dielectric insulator plate; a titanium conductive plate supported on the quartz dielectric insulator plate, the conductive plate comprising a top surface and a bottom surface defining a thickness between the top surface and the bottom surface, wherein the thickness tapers in a radially outward direction along an edge portion of the conductive plate; and a quartz or ceramic dielectric plate disposed upon a top surface of the conductive plate comprising a raised lip having an inner wall corresponding to a substrate support surface; wherein the quartz dielectric insulator plate includes a recess formed in a top surface thereof, the recess configured to accept the conductive and maintain contact with at least a portion of the bottom surface and a portion of the sidewall.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
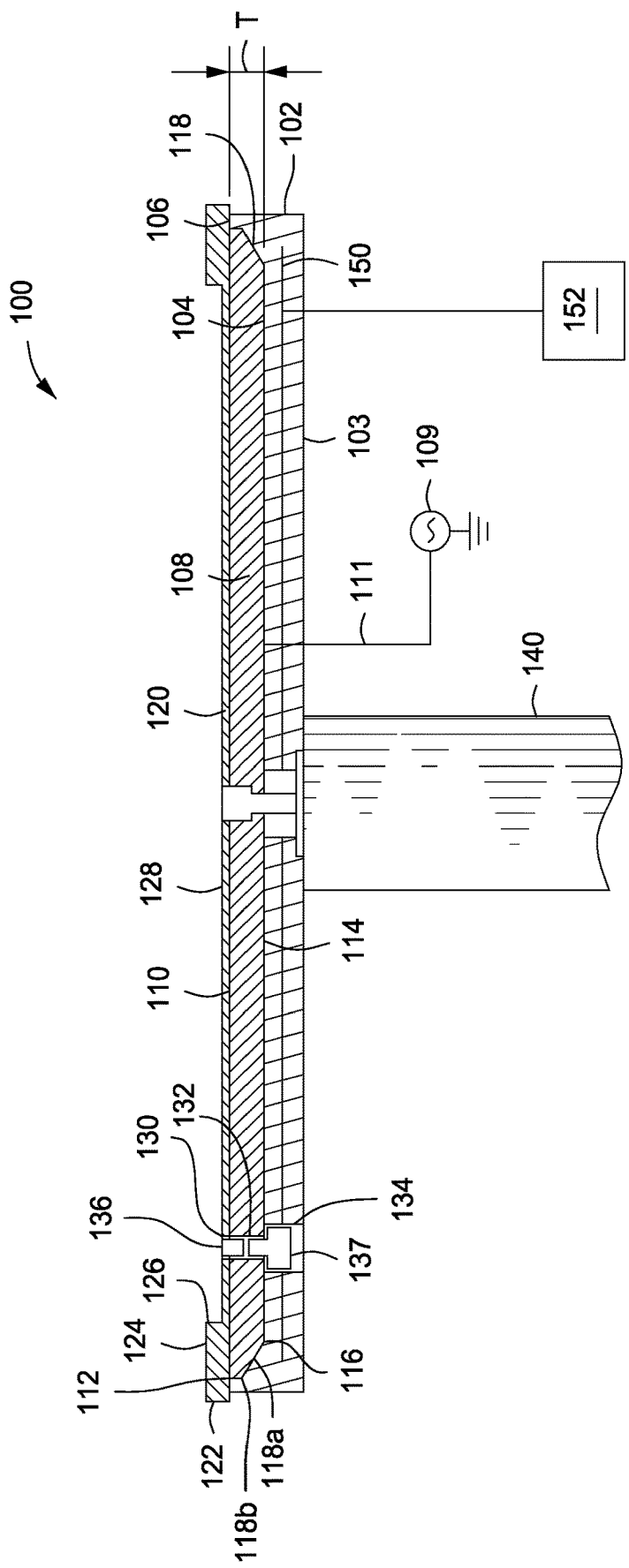
FIG. 1 depicts a schematic side sectional view of a substrate support in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for processing substrates are disclosed herein. More specifically, embodiments of substrate supports that may beneficially affect the process uniformity proximate the edge of a substrate being etched (e.g., edge effects) are provided herein. By beneficially affecting the edge effect, embodiments of the present invention may provide a more uniform etch process across the substrate.

While not intended to be a limitation to the scope of the invention, the inventive apparatus disclosed herein may be particularly advantageous in process chambers configured to perform a plasma etch process, for example pre-clean chambers with argon sputtering capabilities. Examples of suitable plasma etch process chambers include any of the PC-XT® line of processing chambers, or the Preclean II line of preclean chambers, commercially available from Applied Materials, Inc., of Santa Clara, Calif. Other processing chambers from Applied Materials, Inc. or other manufactures may also benefit from the inventive apparatus disclosed herein.

FIG. 1 is a schematic side sectional view of a substrate support 100 according to some embodiments of the present invention. The inventive substrate support comprises a dielectric insulator 102 which may comprise one or more process compatible materials including non-limiting examples such as quartz or ceramic.

The dielectric insulator 102 is sized to be at least as large as the substrate that will be supported on the substrate support 100 and has an upper surface 106 and a bottom surface 103. In some embodiments, the dielectric insulator 102 may include a centrally located recess 104 formed in the upper surface 106 of the dielectric insulator 102. The recess 104 is configured to receive a conductive plate 108 (discussed more fully below) and to maintain contact with at least a portion of the conductive plate 108. The dielectric insulator 102 may be supported in vertical displacement or rotation, or both vertical displacement and rotation, on a support shaft 140.

The conductive plate 108 has a top surface 110 with a top edge 112 and a bottom surface 114 with a bottom edge 116 defining a thickness T between the top surface 110 and the bottom surface 114. The conductive plate 108 may have a tapered edge portion, that is, the thickness T decreases in a radially outward direction along a portion of the radius proximate the edge of the conductive plate 108. In the non-limiting embodiment illustrated in FIG. 1, at the edge portion of the conductive plate 108, a generally upwardly sloped sidewall 118 connects the top edge 112 and bottom edge 116, with one or more straight or curved segments. The tapered edge may be a continuous or partially continuous transition, as illustrated in FIG. 1, or it may be a stepped transition from the bottom edge 116 to the top edge 112 comprising one or more steps. In embodiments including curved segments, the curvature of the segments may be either concave or convex, and may be a combination of concave and convex segments.

In the non-limiting embodiment illustrated in FIG. 1, the sidewall 118 includes two segments. A first sidewall segment 118a is inclined from the bottom edge 116 toward the top edge 112 at an angle of about 15 degrees to about 75 degrees, for example about 45 degrees. A second sidewall segment 118b connects the end of segment 118a opposite the bottom edge 116 with the top edge 112. The second sidewall segment 118b, and additional segments if used (not shown), may extend at the same angle as the first segment 118a, or may extend at a different angle as illustrated. For example, in some embodiments, the second sidewall segment 118b, or the final sidewall segment adjacent the top surface 110, may extend substantially perpendicularly to the top surface 110.

In some embodiments, the recess 104 formed in the upper surface 106 of the dielectric insulator 102 is configured to correspond with (e.g., to mate with) the bottom surface 114 of the conductive plate 108. In the non-limiting embodiment illustrated in FIG. 1, the recess 104 is configured to coaxially receive the conductive plate 108 such that the top surface 110 is coplanar with, substantially coplanar with, a portion of the upper surface 106 of the dielectric insulator 102. In other embodiments, the top surface 110 may be disposed above or below the upper surface 106.

The conductive plate 108 may be formed from a material conductive to at least RF energy, including non-limiting examples such as titanium, aluminum, or a doped ceramic. In some embodiments, the conductive plate 108 may be coupled to an RF biasing source 109 through an RF conduit 111.

In some embodiments, a dielectric plate 120 is disposed on the top surface 110 of the conductive plate 108. The outer periphery of the dielectric plate 120 may extend beyond the periphery of the conductive plate 108 and rest on a portion of the upper surface 106 of the dielectric insulator 102. In some embodiments, the dielectric plate 120 may extend beyond the radial bounds, e.g., the outermost edge 122, of the dielectric insulator 102.

According to some embodiments, the dielectric plate 120 includes a raised lip 124 having an inner wall 126 defining a substrate support surface 128. The substrate support surface is configured to support a substrate, for example a 200 mm, 300 mm, or 450 mm diameter semiconductor substrate, within the inner wall 126. In some embodiments, when the dielectric plate is disposed on the top surface 110 of the conductive plate 108, the tapered edge portion of the conductive plate 108 extends beyond the substrate support surface 128.

The dielectric plate 120 may include a first locating hole 130 aligned coaxially with a second locating hole 132 formed at least partially through the conductive plate 108. A first locating device, for example a first locating pin 136, may pass through the dielectric plate 120 such that the pin rests within the dielectric plate, at or below the substrate support surface 128, and the first locating pin 136 partially passes through the conductive plate 108 to position the dielectric plate 120 at least angularly with respect to the conductive plate 108. A third locating hole 134 may be formed at least partially through the dielectric insulator 102 aligned coaxially with the first locating hole 130. A second locating device, for example a second locating pin 137, may pass through the dielectric insulator 102 and extend partially into the second locating hole 132 to at least angularly position the conductive plate 108 with respect to the dielectric insulator 102.

The locating holes 130, 132, and 134 need not be coaxially aligned in order to position the components of the substrate support. For alignment, adjacent elements, for example the dielectric plate 120 and the conductive plate 108, may have one or more axially aligned holes to accept a first locating pin 136. Similarly, the conductive plate 108 and the dielectric insulator 102 may have one or more axially aligned holes to accept a second locating pin 137. When used together, the locating holes and locating pins may provide at least radial alignment for the dielectric insulator 102, the conductive plate 108, and the dielectric plate 120.

The inventors have observed that a dielectric plate configured and positioned on the top surface of the conductive plate 108 as described above advantageously affects the formation of the plasma and has a beneficial effect on the etch rate uniformity at the edge of the substrate. The inventors have observed that a conductive plate 108 with a tapered edge that extends beyond the substrate support surface 128 may reduce the significance of the edge effects. Without being bound by theory, the inventors believe that the dielectric plate 120 improves uniformity of the plasma through diffusion or spreading of the electric field away from the edges of the conductive plate 108 below.

Figure 2:
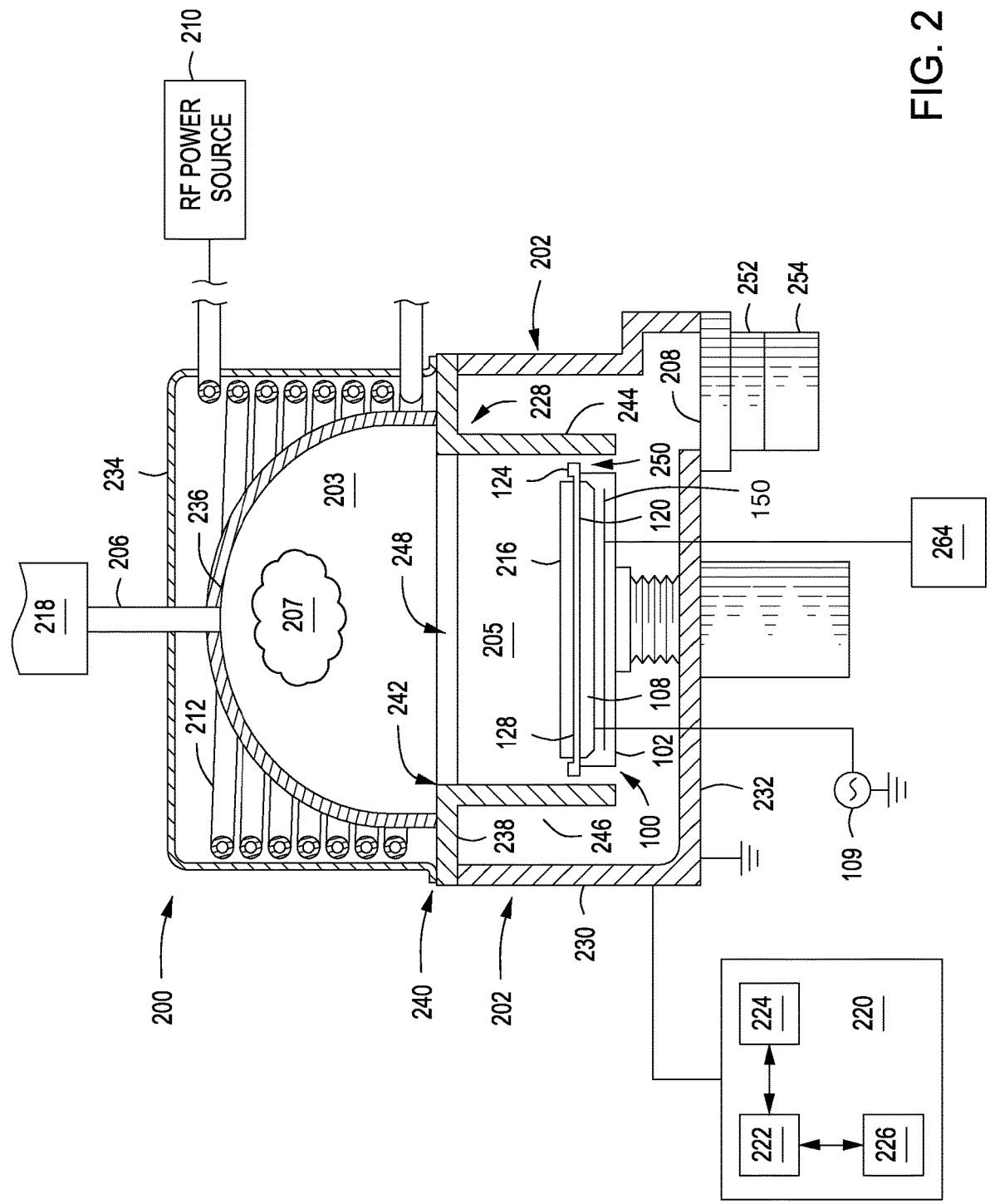
FIG. 2 depicts a schematic illustration of a substrate support within a processing chamber in accordance with some embodiments of this application.

The substrate support may include a heater 150 to heat a substrate, when disposed on the substrate support 100, to a desired temperature. The heater 150 may be any type of heater suitable to provide control over the substrate temperature. For example, the heater 150 may be a resistive heater. In such embodiments, the heater 150 may be coupled to a power source 152 configured to provide the heater 150 with power to facilitate operating the heater 150. In some embodiments, the heater 150 may be embedded within one or more of the dielectric insulator 102, the conductive plate 108, and the dielectric plate 120 of the substrate support 100. The heater 150 may also be located in the interface of the dielectric insulator 102 and the conductive plate 108, or at the interface of the conductive plate 108 and the dielectric plate 120. Alternatively, or in combination, in some embodiments, the heater 150 may be disposed above or proximate to the surface of the substrate support 100. The number and arrangement of the heater 150 may be varied to provide additional control over the temperature of the substrate 216 (FIG. 2). For example, in embodiments where more than one heater is utilized, the heaters may be arranged in a plurality of zones to facilitate control over the temperature across the substrate 216, thus providing increased temperature control.

The inventors have observed that the edge effects typical of some current substrate supports adversely affect the substrate processing at the substrate edge. In general, during preclean processes or other etch or sputter-etch processes, the edge effects have been observed to cause a non-uniformity in the etch rate in which the substrate edge is more aggressively etched than other portions of the substrate.

Under some process conditions, and for some substrates, the increased etch rate at the edge of the substrate is insufficient to cause manufacturing concerns. However, in some processes, for example processes using a biasing RF energy source, the non-uniformity cannot be tolerated and current techniques cannot adequately correct the condition. In some processes, such as high bias processes using certain hardware configurations in which the conductive plate is supplied with about 500 W to about 1 kW of biasing RF power, the edge effect at the substrate edge is sufficient to cause manufacturing concerns with process non-uniformity. In other situations on other hardware configurations, a high bias condition can exist when the biasing power exceeds about 50% of the system capability. In other embodiments, high bias may have different characteristics, but in all cases, as the bias power applied to the substrate support increases to a level desirable for other processing considerations, the non-uniformity at the substrate edge becomes problematic.

In cases of high bias, an undesirable non-uniformity condition exists at the edge in an amount sufficient to affect the yield of semiconductors produced from the substrate. The non-uniformity cannot be tolerated in commercialized and cannot be adequately controlled to an acceptable level using current equipment.

The inventive substrate support disclosed herein can favorably modify the higher etch rate at the edge of the substrate noted on typical substrate supports. Test results have shown that the present substrate support may reduce the etch nonuniformity caused by the edge effect to an acceptable level, even under high bias conditions. Results in some etch uniformity tests showed improvements in uniformity of material removed or etched when compared to substrates processed under similar conditions using current substrate supports.

The inventors noted in some tests that the inventive substrate support produced a uniform, but lower etch rate. That is, the etch rate was more uniform across the substrate with a lesser amount of material removed in a timed period than similar substrates processed under similar conditions using current substrate supports. The etch rate observed using the present substrate support was uniform, or substantially uniform, across the substrate. The lower etch rate has been shown to beneficially improve the controllability of the etch process.

FIG. 2 depicts a substrate processing system in accordance with some embodiments of the present invention. Other process chambers of other configurations may also be modified in accordance with the teachings provided herein.

Generally, a substrate processing system 200 comprises a process chamber 202 having a first volume 203 and a second volume 205. The first volume 203 may include a portion of the process chamber 202 where a plasma 207 is to be received (e.g., introduced or formed). The second volume 205 may include a portion of the process chamber 202 where a substrate is to be processed with reactants from the plasma 207. For example, a substrate support 100 may be disposed within the second volume 205 of the process chamber 202.

The substrate processing system 200 may include a gas inlet 206 coupled to the process chamber to provide one or more processes gases that may be utilized to form a plasma 207 in the first volume. A gas exhaust 208 may be coupled to the process chamber 202, for example in a lower portion of the chamber 202 including the second volume 205. In some embodiments, an RF power source 210 may be coupled to an inductive coil 212 to generate the plasma 207 within the process chamber 202. Alternatively, (not shown), the plasma may be generated remotely, for example, by a remote plasma source or the like, and flowed into the first volume 203 of the process chamber. In some embodiment, a power source 109 may be coupled to the substrate support 100 to control ion flux to a substrate 216 when present on a surface of the substrate support 100. The substrate processing system 200 may include a controller 220, for example, to control one or more components of the substrate processing system 200 to perform operations on the substrate 216. Other and further components and substrate processing system 200 are discussed below.

The process chamber 202 includes walls 230, a bottom 232 and a top 234. A dielectric lid 236 may be disposed under the top 234 and above a process kit 228, the process kit 228 coupled to the process chamber 202. The dielectric lid 236 may be dome-shaped as illustrated in FIG. 2. The dielectric lid 236 may be made from dielectric materials such as glass or quartz, and is typically a replaceable part that may be replaced after a certain number of substrates have been processed in the system 200. The inductive coil 212 may be disposed about the dielectric lid 236 and coupled to an RF power source 210 to inductively couple RF power to the first volume 203 to form the plasma 207 in the first volume 203. Alternatively to or in combination with the inductive coil 212, a remote plasma source (not shown) may be used to form the plasma 207 in the first volume 203 or to provide the first plasma 207 to the first volume 203.

The process kit 228 may include a ring 238, such as a flange, having a first outer edge 240 configured to rest on the wall 230 of the process chamber 202. For example, as shown in FIG. 2, the ring 238 may rest on the wall 230 and have the dielectric lid 236 and the top 234 rest upon the ring 238. However, the embodiments illustrated in FIG. 2 are merely exemplary, and other embodiments are possible. For example, the ring may be configured to rest on an internal feature of the chamber (not shown), such as a lip extending inward from the wall 230 or the like. The ring 238 may further include a first inner edge 242.

The process kit 228 may include a body 244 extending downward from the first inner edge 242 of the ring 238. The body 244 may include sidewalls 246 which define an opening 248 above the substrate support 100. For example, as illustrated in FIG. 2, the diameter of the opening 248 may exceed the diameter of the substrate support 100. For example, a gap 250 formed between the substrate support 100 and the sidewalls 246 of the body 244 may be utilized as a flow path for process gases, byproducts, and other materials to be exhausted to the exhaust 208.

The process kit 228 may comprise any suitable materials compatible with processes being run in the system 200. The components of the process kit 228 may contribute to defining the first and second volumes 203, 205. For example, the first volume 203 may be defined by at least the ring 238 and the dielectric lid 236. For example, in some embodiments, such as illustrated in FIG. 2, the first volume 203 may be further defined by the sidewalls 246 of the body 244. For example, the second volume 205 may be defined by the body 244 and the substrate support 100.

The gas inlet 206 is connected to a processing gas supply 218 and introduces the processing gas into the system 200 during processing. As illustrated, the gas inlet 206 is coupled to the first volume 203 via the dielectric lid 236. However, the gas inlet 206 may be coupled into the first volume 203 at any suitable location. The gas exhaust 208 may comprises a servo control throttle valve 252 and a vacuum pump 254. The vacuum pump 254 evacuates the system 200 prior to processing. During processing, the vacuum pump 254 and the servo control throttle valve 252 maintain the desired pressure within the system 200. Heater 150 is provided to heat the substrate 216 to a desired temperature. The heater 150 is coupled to a power source 264 configured to provide the heater 150 with power to facilitate operating the heater 150.

The controller 220 comprises a central processing unit (CPU) 222, a memory 224, and support circuits 226 for the CPU 222 and facilitates control of the components of the system 200 and, as such, methods of processing a substrate in the system 200. The controller 220 may be one of any form of general-purpose computer processor that can be used in an industrial setting for controlling various chambers and sub-processors. The memory, or computer-readable medium, 224 of the CPU 222 may be one or more of readily available memory such as random access memory (RAM), read only memory (ROM), floppy disk, hard disk, or any other form of digital storage, local or remote. The support circuits 226 are coupled to the CPU 222 for supporting the processor in a conventional manner. These circuits include cache, power supplies, clock circuits, input/output circuitry and subsystems, and the like. The memory 224 stores software (source or object code) that may be executed or invoked to control the operation of the system 200 in the manner described herein. The software routine may also be stored and/or executed by a second CPU (not shown) that is remotely located from the hardware being controlled by the CPU 222.

In an example of operation, the substrate 216 is positioned on the substrate support surface 128 of the substrate support 100. The system 200 may be evacuated to provide a vacuum processing environment. A processing gas is introduced through the gas inlet 206 into the first volume 203. To activate the reaction, a plasma of the processing gas is generated in the processing region through inductive coupling and/or capacitive coupling. The initial plasma 207 may be generated by applying power to the inductive coil 212 sufficient to sustain a plasma in the processing region. It is contemplated that the plasma within the processing region may be excited and sustained during processing by inductive coupling only, capacitive coupling only or combinations of both inductive and capacitive coupling.

In a non-limiting embodiment, the disclosed substrate support may be advantageously used in a preclean chamber used to clean a substrate prior to a deposition process or as a cleaning step between process steps. In such cases, an inert gas such as argon may be used for the processing gas. The inductive coil creates an ionized species of argon molecules, the plasma 207, in the process chamber 202.

In order to direct the ionized molecules in a desired direction, for example towards the substrate 216, in some embodiments a bias, or a high bias, RF power source 109 is coupled to the substrate support 100. In the present invention, the RF is applied to the conductive plate 108. The inventors have observed that the tapered thickness of the conductive plate 108 in the radially outward direction as illustrated at least in FIG. 1 beneficially minimizes edge effects at the substrate edge and produces a more even etch across the substrate.

Thus, an improved apparatus for processing substrates has been provided herein. Embodiments of the inventive apparatus have been described with regard to an argon sputter etch process as an illustration and not as a limitation. Other plasma etch processes may advantageously employ the present substrate support to reduce edge effects during processing of a substrate disposed thereon.

While the foregoing is directed to embodiments of the present invention, other and further embodiments of the invention may be devised without departing from the basic scope thereof.

The invention claimed is:

1. A substrate support to support a substrate in a processing chamber, comprising:
    a dielectric insulator;
    a conductive plate supported on the dielectric insulator, the conductive plate comprising a top surface and a bottom surface defining a thickness between the top surface and the bottom surface, wherein the bottom surface includes a horizontally extending section parallel to the top surface and a tapered section which tapers upward and radially outward of the horizontally extending section; and
    a dielectric plate comprising a substrate support surface disposed upon the top surface of the conductive plate, wherein the tapered section is entirely disposed radially beyond the substrate support surface.

2. The substrate support of claim 1, wherein the tapered section comprises a sidewall connecting the top surface and the bottom surface, wherein the sidewall is inclined at an angle of about 15 degrees to about 75 degrees from horizontal.

3. The substrate support of claim 2, wherein the sidewall comprises one or more straight or curved segments.

4. The substrate support of claim 1, wherein the dielectric insulator includes a recess formed in a top surface thereof, the recess configured to accept at least a portion of the conductive plate and maintain contact with at least a portion of the bottom surface.

5. The substrate support of claim 4, wherein the recess is configured such that the top surface of the conductive plate is coplanar with a portion of the top surface of the dielectric insulator.

6. The substrate support of claim 1, wherein the dielectric insulator is formed from quartz.

7. The substrate support of claim 1, wherein the conductive plate is formed from a metallic material.

8. The substrate support of claim 7, wherein the conductive plate is formed from titanium.

9. The substrate support of claim 1 wherein the conductive plate is formed from a doped ceramic.

10. The substrate support of claim 1, wherein the dielectric plate comprises a raised lip having an inner wall corresponding to the substrate support surface.

11. The substrate support of claim 10, wherein the tapered section is disposed below the raised lip.

12. The substrate support of claim 1, wherein the dielectric plate comprises at least one of silicon dioxide or ceramic.

13. The substrate support of claim 1, wherein the conductive plate is adapted to connect to an RF biasing source.

14. The substrate support of claim 1, further comprising:
    a first locating hole in the dielectric plate;
    a second locating hole in the conductive plate coaxial with the first locating hole; and
    a locating device passing partially through the first locating hole and partially within the conductive plate.

15. A substrate processing apparatus, comprising:
a processing chamber having an internal processing volume;
an RF coil disposed proximate the process chamber to couple RF energy into the internal processing volume;
a biasing RF source; and
a substrate support according to claim 1 disposed within the internal processing volume, wherein the conductive plate is coupled to the biasing RF source.

16. The substrate processing apparatus according to claim 15, further comprising a gas inlet coupled to the processing chamber to provide one or more process gases to the internal processing volume.

17. A substrate support to support a substrate in a processing chamber, comprising:
a dielectric insulator made of quartz;
a titanium conductive plate supported on the dielectric insulator, the titanium conductive plate comprising a top surface and a bottom surface defining a thickness between the top surface and the bottom surface, wherein the bottom surface includes a horizontally extending section parallel to the top surface and a tapered section which tapers upward and radially outward of the horizontally extending section; and
a dielectric plate made of quartz or ceramic disposed upon a top surface of the titanium conductive plate comprising a raised lip having an inner wall defining a substrate support surface, wherein the tapered section is entirely disposed radially beyond the substrate support surface;
wherein the quartz dielectric insulator includes a recess formed in a top surface thereof, the recess configured to accept the titanium conductive plate and maintain contact with at least a portion of the bottom surface and a portion of the titanium conductive plate.

18. The substrate support of claim 17, wherein the titanium conductive plate is adapted to connect to an RF biasing source.

19. The substrate support of claim 17, wherein the tapered section comprises a sidewall having one or more straight or curved segments connecting the top surface and the bottom surface.

* * * * *